United States Patent [19]

Bosman et al.

[11] Patent Number: 5,759,416
[45] Date of Patent: Jun. 2, 1998

[54] METHOD OF SELECTIVELY REMOVING A METALLIC LAYER FROM A NON-METALLIC SUBSTRATE

[75] Inventors: Johan Bosman; Johannes P. C. Van Dooren, both of Eindhoven, Netherlands

[73] Assignee: U.S. Philips Corporation, New York, N.Y.

[21] Appl. No.: 754,341

[22] Filed: Nov. 22, 1996

[30] Foreign Application Priority Data

Nov. 24, 1995 [EP] European Pat. Off. .............. 95203236

[51] Int. Cl.$^6$ .................. B44C 1/22; C23F 1/00
[52] U.S. Cl. .................. 216/13; 216/65; 216/78; 216/75; 216/77
[58] Field of Search .................. 216/13, 65, 75, 216/78, 77; 219/121.68, 121.69

[56] References Cited

U.S. PATENT DOCUMENTS 4,498,925  2/1985  Cline ..................... 216/65 X
4,786,358  11/1988  Yamazaki et al. ..................... 216/65 X
4,943,346  7/1990  Mattelin ..................... 216/65 X
5,509,553  4/1996  Hunter et al. ..................... 216/65 X

FOREIGN PATENT DOCUMENTS

0466202A1  1/1992  European Pat. Off. .

*Primary Examiner*—William Powell
*Attorney, Agent, or Firm*—Steven R. Biren

[57] ABSTRACT

A method of selectively removing a metallic layer (3) from a non-metallic substrate (1) includes the steps of arranging for the metallic layer (3) to be overlaid by a coating (7) of Sn-rich metallic material, and directing a laser beam of wavelength $\lambda$ onto a selected area (5') of the coating (7), $\lambda$ being chosen to lie in the range 450–650 nm, thereby causing localized heating of the coating (7) in this area (5') and consequent ablative removal of the underlying portion of the metallic layer (3). The method is particularly useful in the manufacture of printed circuit boards.

6 Claims, 2 Drawing Sheets

METHOD OF SELECTIVELY REMOVING A METALLIC LAYER FROM A NON-METALLIC SUBSTRATE

BACKGROUND OF THE INVENTION

The invention relates to a method of selectively removing a metallic layer from a non-metallic substrate.

In particular, the method relates to a method of manufacturing a printed circuit board (PCB), comprising the steps of:
(a) providing an electrically insulating substrate on which a metallic layer has been applied;
(b) selectively removing the metallic layer from the substrate so as to form a pattern of metallic lands on the substrate.

The term "non-metallic" as here employed should be interpreted as referring to substances such as organic polymers, solid organic compounds, ceramics, vitreous materials, crystalline materials, carborundum, silicon, etc. It is not necessary that the entire substrate be comprised of such material: for example, a non-metallic coating on a metallic body, or a non-metallic portion of a composite body, also qualify as "non-metallic substrates" in the current context. Similarly, an electrically insulating coating on an electrically conductive body, or an electrically insulating portion of a composite body, are both intended to qualify as "electrically insulating substrates" in the current context.

A method as specified in the opening paragraph is commonly employed in the manufacture of PCBs, which generally comprise a non-conducting substrate on which an intricate pattern of Cu lands and tracks has been provided (on one or both major surfaces). Such a pattern can be achieved by uniformly metallising a major surface of the substrate with a thin layer of Cu, which is itself subsequently coated with a layer of photoresist (e.g. a mixture of an alkaline-soluble polymer, such as NOVOLAK, and a light-sensitive dissolution inhibitor, such as O-naphtoquinonediazide). This layer of photoresist is then irradiated with ultra-violet light through a patterned mask (whence the O-naphthoquinonediazide is locally converted to alkaline-soluble 3-indenecarboxylic acid), and is subsequently exposed to an alkaline developer. The result of this procedure is that the irradiated portions of photoresist are dissolved, whereas the non-irradiated portions of photoresist remain intact, and can therefore act as etch masks. Upon subsequent treatment in an etching bath, any areas of Cu which are not thus protected by an etch mask will be removed, whereas those located beneath a photoresist mask will remain behind. The substrate is thus eventually endowed with a pattern of Cu features (e.g. lands and interconnective tracks) which corresponds to the employed mask pattern. If so desired, the remaining film of irradiated photoresist on the exposed surface of each of these features can be "stripped" (i.e. chemically removed, e.g. using an organic solvent). It should be noted that the selective etching in this method can also be performed using a physical etchant, such as a plasma.

A drawback of this known method is that it involves at least five process steps, i.e. resist application, irradiation, development, etching, resist removal. In addition, it relies on the use of environmentally unfriendly organic chemicals (e.g. in the employed photoresist).

As an alternative to said method, one may attempt to directly achieve the desired selective removal of the metallic layer using laser ablation. In such a scenario, it transpires that, in order to achieve sufficient radiative heating of the metallic layer, it is generally necessary to employ an infra-red laser beam, e.g. from a 1064-nm Nd:YAG laser. However, such infra-red wavelengths are not only strongly absorbed by the metallic layer, but also by the underlying substrate. As a consequence, the substrate surface almost inevitably suffers substantial burn damage, which, for example, can lead to an increased risk of short-circuiting due to the formation of unwanted carbon-rich tracts. In addition, the substrate may become warped as a result of excessive heating.

SUMMARY OF THE INVENTION

It is an object of the invention to provide a method in which laser ablation is used to selectively remove a metallic layer from a non-metallic substrate, without untoward risk of damaging the substrate by burning or warping.

This and other objects are achieved in a method as specified in the opening paragraph, characterised in that it comprises the following steps:
arranging for the metallic layer to be overlaid by a coating of Sn-rich metallic material;
directing a laser beam of wavelength $\lambda$ onto a selected area of the coating, $\lambda$ being chosen to lie in the range 450–650 nm, thereby causing localised heating of the coating in this area and consequent ablative removal of the underlying portion of the metallic layer. The term "Sn-rich" is here intended to refer to coatings containing at least 50 at. % Sn (tin), and favourably at least 75 at. % Sn. The insights upon which this inventive method are based will now be elucidated.

In general, visible-wavelength lasers operating at moderate powers (of the order of 1–5 Watt) suffer too much reflection at metal surfaces to produce effective heating of the underlying body of metal; it is for this reason that infra-red lasers have heretofore been used for this purpose. However, the inventors have observed that Sn forms a notable exception to this behaviour, in that it demonstrates enhanced absorption at visible wavelengths, and particularly in the green portion of the spectrum. By depositing a relatively thin coating of Sn-rich metal on an underlying metallic layer (containing relatively little or no Sn), the invention therefore provides a means by which visible radiant energy can be effectively used to heat the metallic layer: first via absorption in the Sn-rich coating, and then via thermal conduction through to the underlying metallic layer. The heat absorption and transfer in this process is efficient enough to cause rapid ablation of the underlying metallic layer, even at moderate laser fluences, and yet the wavelength of the employed laser beam is such as to avoid excessive heating (burning) of the ultimately underlying non-metallic substrate. A particular advantage of Sn is that it forms relatively few intermetallic bonds, so that it is easy to apply to and remove from other metals. In addition, it is readily available, cheap and non-toxic.

The Sn-rich coating on the metallic layer may, for example, be provided using electroless deposition (e.g. sputter deposition) or an electrolytic procedure (e.g. in a bath of aqueous tin chloride or molten tin). Alternatively, a thin coating of molten tin can be brushed, sprayed or spin-coated onto the metallic layer.

The chosen thickness $t_c$ of the tin-rich coating will depend on the available laser fluence. In general, the larger the value of $t_c$, the greater the laser fluence required to achieve (rapid) ablation of the metallic layer. For laser fluences of the order of 0.1–1 kW/mm$^2$, favourable results are obtained when $t_c \leq 2.5$ μm.

Patternwise selective removal of the metallic layer may be conducted simply by running a focused laser spot along pre-selected routes on the overlying coating. However, such a procedure can be quite time-consuming for relatively large coating areas. An alternative method, which is far quicker, is to project and focus a broadened laser beam through a pre-patterned stencil plate onto (large areas of) the entire coating, thereby simultaneously heating all regions of the metallic layer which are to be ablated. Broadening a given laser beam in this way decreases the imparted laser fluence in the focal plane, but this decrease can be compensated for by choosing a larger laser power to begin with. In general, diffraction effects do not cause serious degradation of the pattern-definition when the laser beam is broadened in this manner.

In many applications, such as in printed circuit board manufacture, for example, it will not be necessary to remove the Sn-rich coating after the inventive method has been performed; such a method then involves only two process steps, namely coating-application and laser irradiation. However, if removal of the coating is nevertheless desired, then it can be performed using commercially available tin strippers, for example; this then entails an extra process step.

The inventive method allows intricate patterning of metallic layers, with a high resolution. In investigative experiments, the inventors routinely applied the method to produce well-defined features having dimensions of the order of 100 μm.

A preferential embodiment of the method according to the invention is characterised in that the coating of Sn-rich metallic material comprises at least 90 at. % Sn, and that 500 nm≦λ≦550 nm. As already stated, Sn is particularly absorptive at green wavelengths, so that the inventive method is most effective for λ=500–550 nm. In addition, the greater the proportion of Sn in the applied coating, the more effective will be that coating's absorption of the incident visible light. In this respect, a coating of pure Sn can be expected to yield the best results.

In a particularly advantageous realisation of the preceding embodiment, the employed laser beam is derived from a second-harmonic Nd:YAG laser or a copper vapour laser. Nd:YAG has a strong laser line at 1064 nm, which produces green light of wavelength 532 nm after frequency-doubling; copper vapour lasers, on the other hand, produce strong lines at approximately 511 and 578 nm. The power output of such lasers lies in a particularly practical range for application in the invention (typically of the order of 1–5 Watt and 5–25 Watt, respectively, for commercially available lasers).

A preferential embodiment of the inventive method is characterised in that $t_c \leq \lambda$. For coatings of this thickness, the penetration-depth of an incident laser beam will be of the same order of magnitude as $t_c$ itself, so that the coating will effectively be directly heated throughout its entire thickness by the incident laser beam. As the coating is made thicker, however, the light intensities arriving at its lower reaches will become more negligible, so that only the upper reaches of the coating will be directly heated by the incident beam. Consequently, heat-transfer to the underlying metallic layer will in that case be influenced by the thermal conductivity of the lower reaches of the coating; since Sn is a relatively poor conductor, the efficiency of the inventive method will be accordingly reduced.

The thickness $t_m$ of the metallic layer is favourably less than 25 μm, and preferably less than 10 μm. The larger the value of $t_m$, the greater the quantity of energy required to heat the metallic layer to a given temperature, and the longer it takes to achieve such heating. In general, the inventors have observed that, if $t_m > 25$ μm, then, for moderate laser fluences (of the order of 0.1–1 kW/mm$^2$), the metallic layer may not be sufficiently heated throughout its entire thickness to allow it to be completely ablated from the substrate. It then becomes necessary either to use a larger laser power, to concentrate the available laser power into a smaller area, or to scan the laser beam more slowly over each area to be ablated. Alternatively, the metallic layer can be subjected to supplementary heating before and/or during irradiation, e.g. by directing a hot gas flow along the metallised side of the substrate, or by warming the metallised side with an infrared lamp.

A preferential embodiment of the inventive method is characterised in that $t_m \leq 5$ μm. For such thicknesses, rapid ablation of various metallic layers (e.g. Cu, Al, Au and Ni) can be achieved using a 1-Watt second-harmonic Nd:YAG laser focused to a spot size of the order of 100 μm, without supplementary heating.

The invention relates in particular to a method of manufacturing a printed circuit board, comprising the steps of:

(a) providing an electrically insulating substrate on which a metallic layer has been applied;
(b) selectively removing the metallic layer from the substrate so as to form a pattern of metallic lands on the substrate.

According to the invention, such a method is characterised in that step (b) is performed using the inventive method heretofore elucidated.

The term "printed circuit board" as employed in the previous paragraph refers to both circuit boards and foils, whether single-sided or double-sided, and whether intended for surface-mounted or hole-mounted components. In addition, the term should be interpreted as encompassing moulded interconnect devices (MIDs). Substrate materials commonly encountered in step (a) include, for example, glass-fiber-reinforced epoxy resins, hard-paper epoxy resins, hard-paper phenol resins and polyethene terephthalate (PET) foils. The inventors have observed that, in general, non-aromatic substrate materials are preferable to aromatic substrate materials, because the former tend to be less susceptible to surface carbonisation. The metallisation of the substrate may be performed, for example, by electroless deposition of metal onto the substrate (e.g. using sputter deposition), by gluing a metal film to the substrate, or by laminating a metal film onto a softened surface of the substrate. Suitable metals for this purpose include Cu, Al, Au, and various alloys containing one or more of these elements.

Apart from its application in the manufacture of PCBs, the inventive method can be usefully employed in several other areas. These include, for example, the creation of electrode patterns on ceramic dielectric sheets for the purposes of capacitor manufacture, the provision of pixel arrays on a glass plate for use in liquid crystal displays, the creation of connective metallic tracks within the (plastic) housing of an integrated circuit, as well as various decorative applications and product marking procedures.

BRIEF DESCRIPTION OF THE DRAWING

The invention and its attendant advantages will be further elucidated with the aid of exemplary embodiments and the accompanying schematic drawings, whereby.

DESCRIPTION OF THE PREFERRED EMBODIMENTS

Embodiment 1

Figure 1:
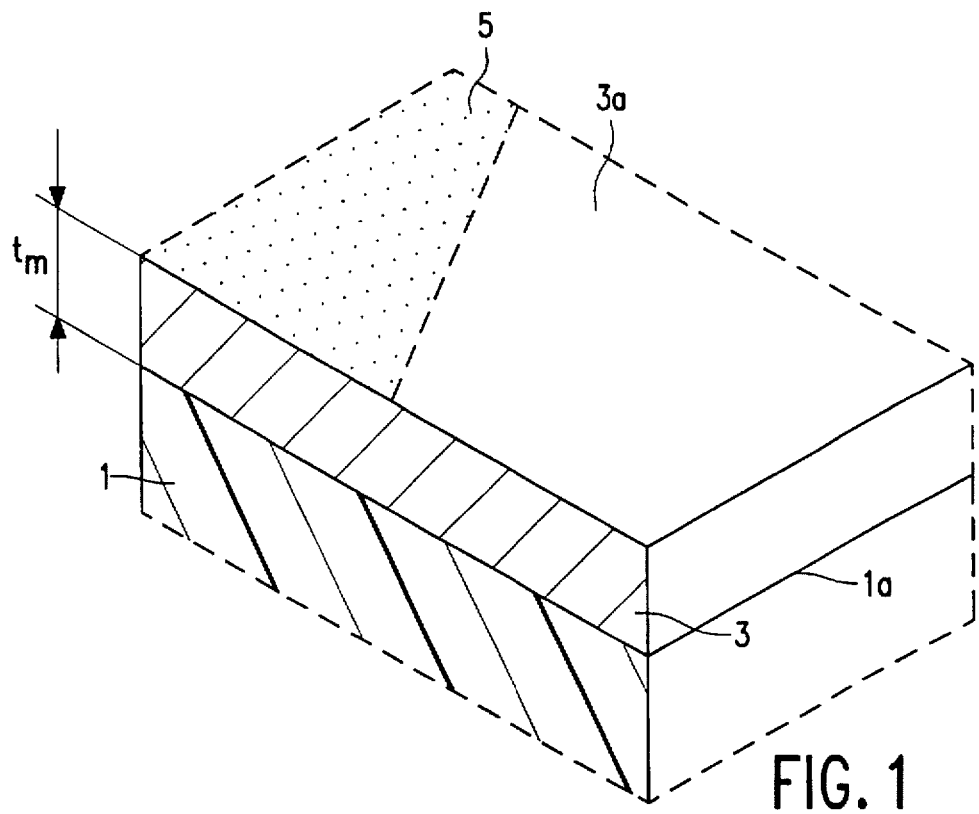
FIG. 1 renders a perspective view of part of a non-metallic substrate on which a metallic layer has been provided.
Figure 2:
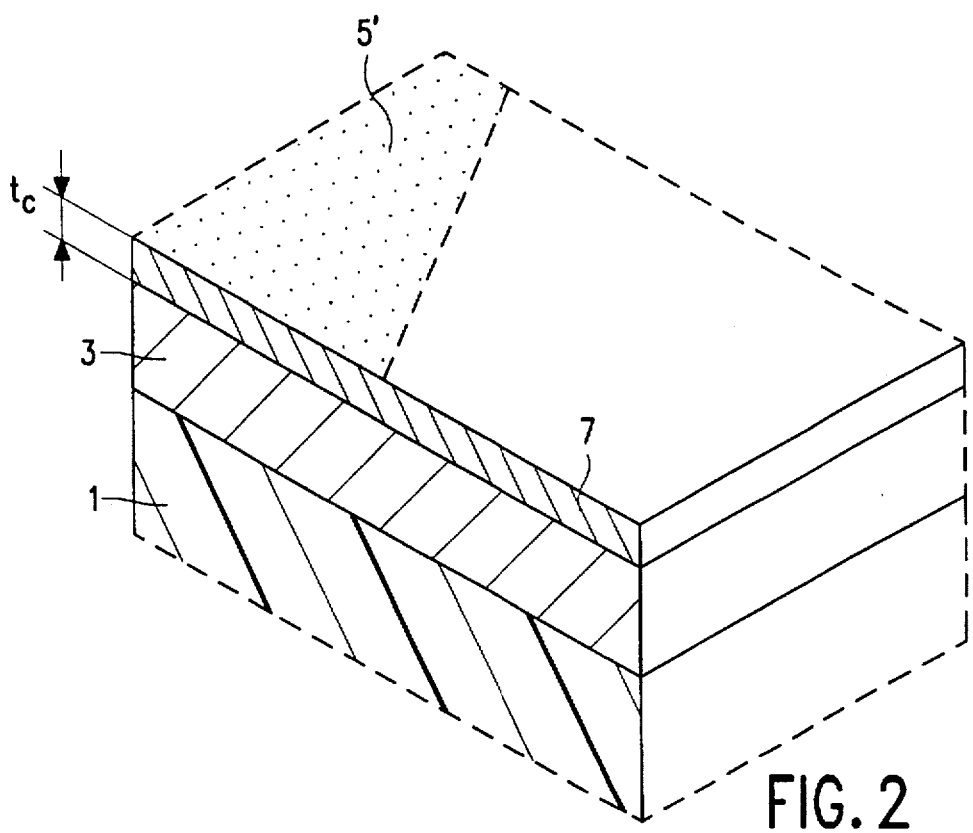
FIG. 2 shows the subject of FIG. 1 after the provision thereupon of a coating of Sn-rich metallic material.
Figure 3:
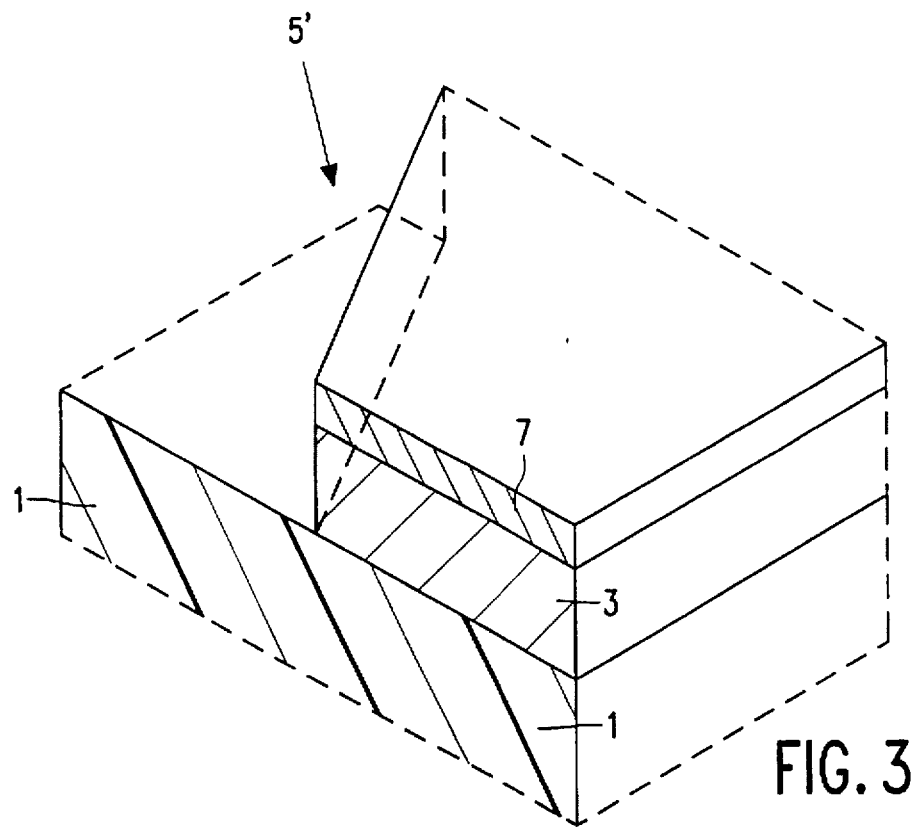
FIG. 3 depicts the subject of FIG. 2 subsequent to the ablative removal of part of the metallic layer, in accordance with the invention.

FIGS. 1–3 depict various aspects of the method according to the invention. Corresponding features in the various Figures are denoted by the same reference symbols.

FIG. 1 shows part of a substrate 1 which has been provided on a major surface $1_a$ with a metallic layer 3 of thickness $t_m$. The layer 3 has an exposed surface $3a$. Also depicted is a surfacial region 5 which demarcates a portion of the layer 3 to be selectively removed in a later process step. For clarity, the region 5 is here indicated using shading.

In a particular embodiment, the substrate 1 is comprised of ULTEM—a commercially available glass-fiber-reinforced epoxy resin marketed by General Electric Plastics. The layer 3 is comprised of substantially pure Cu, and has a thickness $t_m$ of 4 µm. The layer 3 is provided on the substrate 1 by thermally softening the surface $1a$ and directly laminating a Cu film thereupon (using, for example, a roller press).

In FIG. 2, the exposed surface $3a$ of the layer 3 has been provided with a Sn-rich metallic coating 7 of thickness $t_c$. In a specific example, the layer 7 is comprised of substantially pure Sn, and $t_c \approx 500$ nm. The shaded region 5' directly overlies the region 5 depicted in FIG. 1.

In FIG. 3, the region 5' and the underlying portions of the layer 3 and coating 7 have been ablatively removed in accordance with the invention. To this end, a 532-nm laser beam from a frequency-doubled Nd:YAG laser was scanned over the surfacial region 5'. The laser beam (not depicted) had a power of 1 Watt, and was focused into a spot of diameter 80 µm on the surfacial region 5'. This spot was translated at a linear speed of 30 mm/s. All portions of the region 5' which were traversed by the spot were rapidly heated to a temperature of the order of 1000° C., causing an associated temperature-rise in the layer 3 as a result of thermal conduction from the coating 7. As a consequence of this temperature rise, the layer 3 was locally ablated from the substrate 1, taking the overlying coating 7 with it.

Embodiment 2

Figure 4:
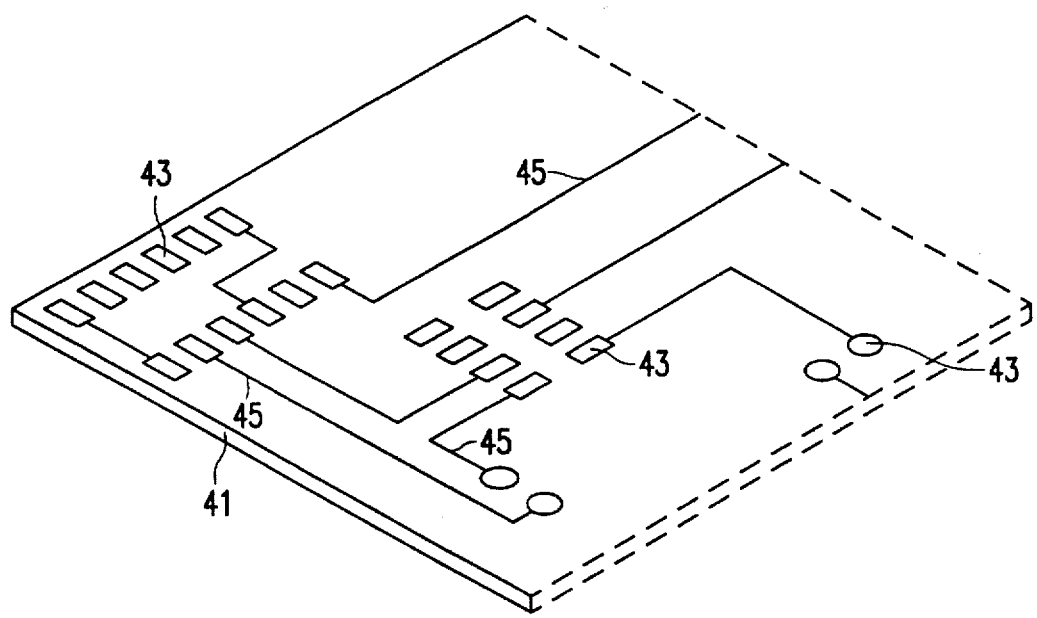
FIG. 4 is a perspective view of a Printed Circuit Board manufactured in accordance with the invention.

FIG. 4 renders a perspective view of a PCB manufactured using a method as claimed in claim 6. A fire-retardant glass-epoxy substrate 1 was uniformly laminated on one side with a 5-µm layer of Cu, which was then overlaid by a 450-nm coating of Sn. Using a 2-Watt frequency-doubled Nd:YAG laser, selected portions of the Cu layer were ablated in accordance with the invention. This was done in such a manner as to leave behind a series of Cu lands 43 and interconnective tracks 45. The lands 43 correspond to the mounting-positions of the pins of various electrical components (e.g. integrated circuits, resistors, capacitors, diodes, etc.), whereas the interconnective tracks 45 serve to connect such components according to a given electrical circuit arrangement.

As a characteristic of the inventive method employed to create them, both the lands 43 and the tracks 45 retain a coating of Sn-rich material on their upper surfaces. If so desired, this coating may be removed using a commercially available tin stripper. However, the presence of the coating will usually have no adverse effect on subsequent soldering applications, so that such removal is generally unnecessary.

What is claimed is:

1. A method of selectively removing a metallic layer from a non-metallic substrate, characterized in that it comprises the following steps:

arranging for the metallic layer to be overlaid by a coating of Sn-rich metallic material; and directing a laser beam of wavelength $\lambda$ onto a selected area of the coating, $\lambda$ being chosen to lie in the range 450–650 nm, thereby causing localized heating of the coating in this area and consequent ablative removal of the underlying portion of the metallic layer.

2. A method according to claim 1, characterized in that the coating of Sn-rich metallic material comprises at least 90 at. % Sn, and that 500 nm $\leq \lambda \leq$ 550 nm.

3. A method according to claim 2, characterized in that the employed laser beam is derived from a second-harmonic Nd:YAG laser or a copper vapor laser.

4. A method according to any of the preceding claims, characterized in that the coating of Sn-rich metallic material is of a thickness $t_c \leq \lambda$.

5. A method according to claim 1, characterized in that $t_m \leq 5$ µm.

6. A method of manufacturing a printed circuit board, comprising the steps of:

(a) providing an electrically insulating substrate on which a metallic layer has been applied; and (b) selectively removing the metallic layer from the substrate in accordance with the method of claim 1 so as to form a pattern of metallic lands on the substrate.

* * * * *